United States Patent [19]

Basi

[11] 4,129,457

[45] Dec. 12, 1978

[54] POST-POLISHING CLEANING OF SEMICONDUCTOR SURFACES

[75] Inventor: Jagtar S. Basi, Fishkill, N.Y.

[73] Assignee: International Business Machines Corporation, Armonk, N.Y.

[21] Appl. No.: 799,886

[22] Filed: May 23, 1977

[51] Int. Cl.$^2$ .............................................. B08B 3/08
[52] U.S. Cl. ........................................ 134/2; 29/580; 51/323; 134/29
[58] Field of Search ............... 134/2, 29; 252/547; 51/323; 156/647; 260/567.6 R, 567.6 H, 567.6 M; 29/580

[56] References Cited

U.S. PATENT DOCUMENTS

| 3,342,652 | 9/1967 | Reisman et al. ............... 156/647 X |
| 3,345,300 | 10/1967 | Speel ................................. 252/547 |

OTHER PUBLICATIONS

Meek et al., *J. Electrochem. Soc.*, "Silicon Surface Contamination : Polishing and Cleaning", vol. 120, No. 9, Sep. 1973, pp. 1241-1242.

*Primary Examiner*—S. Leon Bashore
*Assistant Examiner*—Marc L. Caroff
*Attorney, Agent, or Firm*—David M. Bunnell

[57] ABSTRACT

Semiconductor materials are cleaned after silica polishing by treatment with an aqueous quarternary ammonium salt solution followed by rinsing in water. The treatment coagulates the silica sols and suspends them so that they do not form a film on the semiconductor surface. The treatment preserves the hydrophobic nature of the polished surface.

9 Claims, No Drawings

POST-POLISHING CLEANING OF SEMICONDUCTOR SURFACES

BACKGROUND OF THE INVENTION

This invention relates generally to the cleaning of semiconductor materials and specifically to the post silica polish cleaning of semiconductor wafers.

With the advent of microminiaturization of electronic devices, the need for damage-free, smooth and clean semiconductor wafer surfaces has become increasingly important. Smooth, polished surfaces are obtained by the use of polishing slurries. Silica polishing is an example of a typical polishing process. In the silica polishing process, a polishing slurry is used which includes a colloidal silicon dioxide abrasive, sodium dichloroisocyanurate as an oxidizing agent, and sodium carbonate as a base. The pH of the polishing slurry is below 10. After polishing, it is necessary to clean the polished surface to remove the polishing slurry and other surface contaminants with a minimum of chemical or mechanical surface damage.

At the end of the silica polishing process, removal of the following materials from the wafer surface must be considered in order to produce a clean surface:
1. Colloidal silicon dioxide.
2. Sodium dichloro-isocyanurate and its reaction products with sodium carbonate.
3. Sodium carbonate.
4. Amorphous silicon dioxide.
5. Other metallic impurities deposited on silicon surfaces from slurry components.

Various mechanical and chemical processes have been used to clean silica or other metal oxide based slurry polished wafers. These processes either produce mechanical damage, change the surface characteristics significantly, or use chemicals which present environmental and/or hygienic considerations. Most of the chemical methods produce hydrophillic surfaces which are susceptible to reaction with atmospheric contaminants.

A new physico-chemical process has been found which results in a clean, hydrophobic semiconductor surface without damaging the surface.

BRIEF SUMMARY OF THE INVENTION

In accordance with this invention there is provided a method of removing colloidal silica from a semiconductor surface comprising treating the surface with an aqueous solution of a quarternary ammonium salt to coagulate and suspend the silica in the aqueous solution and removing the aqueous solution from the surface. The surface then can be further treated with $NH_4OH$ to remove any heavy metal contaminants.

DETAILED DESCRIPTION

The silicon dioxide based aqueous slurries used in polishing semiconductor surfaces include colloidal silicon as the abrasive material, an oxidizing agent such as sodium dichloroisocyanurate and a base such as sodium carbonate.

After Polishing with silicon dioxide slurries, the polished surface is normally hydrophobic. This is believed to be due to the condensation of adjacent surface hydroxyl groups to form a siloxane-type surface oxide layer. The surface is contaminated with colloidal $SiO_2$, amorphous $SiO_2$, sodium carbonate and polishing pad material. Water washing alone does not remove the contaminants. Oxidizing agent treatments such as NaClO followed by a $NH_4OH$ rinse produce a clean surface but chemically alter the surface by producing free hydroxyl groups which gives the surface a hydrophilic nature. Attempts to coagulate and remove the silica with electrolytes such as NaCl, although preserving the hydrophobic nature of the surface, are found to form a film on the surface which is believed to be $SiO_2$.

A clean, film free, hydrophobic surface is obtained by the use of cationic surfactants which are quarternary ammonium salts. Such materials are represented by the formula

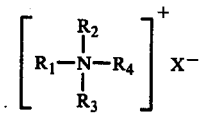

where
$R_1$ is a long chain alkyl group containing about 12 to 18 carbons
$R_2$ and $R_3$ and $R_4$ are lower alkyl and substituted lower alkyl groups and various combinations thereof such as methyl, ethyl, propyl, benzyl, etc., and
$X^-$ is an anion.

Preferred anions are halogens ($Cl^-$, $Br^-$, $I^-$) but other anions such as sulfate, methyl sulfate, phosphate, acetate, citrate, tartrate can be used.

Examples of such compounds are long chain alkyl ($C_{12}$–$C_{18}$ mixed or pure) dimethyl benzyl ammonium chloride, cetyl dimethylethyl ammonium bromide, and cetyl trimethyl ammonium bromide.

A suitable minimum concentration of the quarternary ammonium salt in water is about 0.1 weight percent with about 0.5 weight percent being preferred. Greater amounts can be used effectively but as a practical matter are not necessary. After the polishing operation is completed, the polished semiconductor article is, without being allowed to dry, treated with the quarternary ammonium salt solution. A preferred treatment is to place the article in the solution at ambient temperature and allowing it to remain in the solution for several minutes. Stirring or other form of agitation aids the cleaning process.

The article is next rinsed with $H_2O$ and then, where heavy metal ion contamination may be present, with dilute $NH_4OH$ (about 3 to 5% by weight). The $NH_4OH$ rinse removes any heavy ion contamination without altering the hydrophobic nature of the semiconductor surface. A complexing agent could also be added to the $NH_4OH$ solution to aid in ion removal. The surface is then rinsed in water and can be brush cleaned with water.

The invention is further illustrated by, but is not intended to be limited to the following examples in which parts are parts by weight unless otherwise indicated.

EXAMPLE 1

Silicon wafers which were polished with a silica polishing slurry and then water rinsed are taken from the polishing machine and, without drying are placed into a 0.5% by weight solution of mixed alkyl ($C_{12}$–$C_{18}$) dimethyl benzyl ammonium chlorides for 5 minutes. The mixture contained, by weight, 5% of material having a $C_{12}$ alkyl group; 60% having a $C_{14}$ alkyl group; 30% having a $C_{16}$ alkyl group and 50% having a $C_{18}$ alkyl group. The wafers are removed from solution and rinsed with deionized water and then treated in a spray of 3% by weight aqueous NH4OH for 30 seconds followed by a spray rinse with deionized water and spin drying in a hot nitrogen atmosphere. The entire rinsing process is performed in an automated Coretek spray dry machine taking a total of 5 minutes. The wafers are then brush cleaned using deionized water. The wafers are hydrophobic after the cleaning process (water beads on the surface). The wafer surfaces are clean and haze free. An emission spectrographic analysis of the cleaned wafers indicated negligible amounts of Al, Ca, Cr, Cu, Fe, Mg, Na and Ti.

EXAMPLE 2

The cleaning process of Example 1 was repeated using, in place of the mixed alkyl dimethyl benzyl ammonium chloride, either a 0.5% by weight solution of cetyl dimethylethyl ammonium bromide or a 0.5% by weight solution of cetyl trimethyl ammonium bromide. These solutions also gave clean hydrophobic haze free wafer surfaces.

The foregoing process provides polished semiconductor surfaces which are clean, haze free and hydrophobic. The surfaces are not degraded by the cleaning process and the process employs environmentally and hygienically acceptable materials.

While the invention has been particularly shown and described with reference to preferred embodiments thereof, it will be understood by those skilled in the art that various changes in form and detail may be made therein without departing from the spirit and scope of the invention.

What is claimed is:

1. In a method for cleaning a semiconductor surface following the polishing of said surface with a polishing slurry containing colloidal silica, the improvement comprising removing said colloidal silica from said surface by contacting said surface with an aqueous quarternary ammonium salt solution containing at least about 0.1 percent by weight of a quarternary ammonium salt represented by the formula:

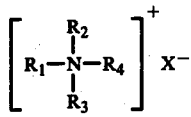

where
   $R_1$ is a long chain alkyl group containing about 12 to 18 carbons; $R_2$, $R_3$ and $R_4$ are selected from the group consisting of lower alkyl groups and substituted lower alkyl groups having 1 to 7 carbon atoms including various combinations thereof and $X^-$ is an anion, so as to coagulate and suspend said silica in said solution and then removing said solution from said surface.

2. The method of claim 1 wherein the removing of the solution from said surface includes a water rinse.

3. The method of claim 1 wherein said salt is an alkyl dimethyl benzyl ammonium chloride where the alkyl group contains from about 12 to 18 carbons.

4. The method of claim 1 wherein said salt is cetyl dimethylethyl ammonium bromide.

5. The method of claim 1 wherein said salt is cetyl trimethyl ammonium bromide.

6. In a method for cleaning a semiconductor surface following the polishing of said surface with a silica polishing slurry and the rinsing of said surface with water to remove the bulk of said slurry, the improvement comprising removing colloidal silica from said surface following the rinsing of said surface with water by contacting the surface without drying with an aqueous quarternary ammonium salt solution to remove colloidal silica, said solution containing at least about 0.1 percent by weight of a quarternary ammonium salt represented by the formula:

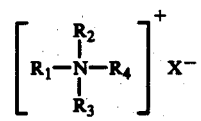

where
   $R_1$ is a long chain alkyl group containing about 12 to 18 carbons; $R_2$, $R_3$ and $R_4$ are selected from the group consisting of lower alkyl groups and substituted lower alkyl groups having 1 to 7 carbon atoms including various combinations thereof and $X^-$ is an anion, rinsing said surface with water to remove said salt solution from said surface, and then contacting said surface with an aqueous NH4OH solution containing about 3 to 5 percent by weight NH4OH to remove heavy metal ion contaminants.

7. The method of claim 6 wherein said salt is an alkyl dimethyl benzyl ammonium chloride where the alkyl group contains from about 12 to 18 carbons.

8. The method of claim 6 wherein said salt is cetyl dimethylethyl ammonium bromide.

9. The method of claim 6 wherein said salt is cetyl trimethyl ammonium bromide.

* * * * *